US008427921B2

(12) United States Patent
Kawasaki et al.

(10) Patent No.: US 8,427,921 B2
(45) Date of Patent: Apr. 23, 2013

(54) LIGHT EMITTING DEVICE, OPTICAL PICKUP APPARATUS AND METHOD FOR MANUFACTURING THE SAME

(75) Inventors: Ryoichi Kawasaki, Isesaki (JP); Tohru Hotta, Okaya (JP)

(73) Assignees: SANYO Electric Co., Ltd., Moriguchi-shi (JP); SANYO Optec Design Co., Ltd., Tokyo (JP)

( * ) Notice: Subject to any disclaimer, the term of this patent is extended or adjusted under 35 U.S.C. 154(b) by 0 days.

(21) Appl. No.: 13/545,563

(22) Filed: Jul. 10, 2012

(65) Prior Publication Data

US 2012/0275289 A1 Nov. 1, 2012

Related U.S. Application Data

(62) Division of application No. 12/986,595, filed on Jan. 7, 2011, now abandoned.

(30) Foreign Application Priority Data

Jan. 8, 2010 (JP) ................................. 2010-002702

(51) Int. Cl.
*G11B 7/00* (2006.01)
(52) U.S. Cl.
USPC ............... 369/110.04; 369/124.03; 369/44.37
(58) Field of Classification Search ............. 369/110.04, 369/124.03, 44.37
See application file for complete search history.

(56) References Cited

U.S. PATENT DOCUMENTS

| 2004/0257958 | A1* | 12/2004 | Kimura et al. | 369/112.03 |
|---|---|---|---|---|
| 2005/0152258 | A1 | 7/2005 | Komma et al. | |
| 2005/0219987 | A1 | 10/2005 | Hashimura et al. | |
| 2005/0249064 | A1 | 11/2005 | Kimura et al. | |
| 2006/0126673 | A1* | 6/2006 | Nagatomi et al. | 372/9 |
| 2006/0176578 | A1 | 8/2006 | Kimura | |
| 2008/0049584 | A1* | 2/2008 | Tan et al. | 369/112.16 |
| 2009/0310465 | A1* | 12/2009 | Komma et al. | 369/112.08 |
| 2010/0067356 | A1* | 3/2010 | Fujii et al. | 369/112.24 |

FOREIGN PATENT DOCUMENTS

JP 2009-170091 7/2009

OTHER PUBLICATIONS

Kawasaki, R. et al., U.S. Office Action mailed Dec. 9, 2011, directed to U.S. Appl. No. 12/986,595; 11 pages.
Kawasaki, R. et al., U.S. Office Action mailed Apr. 12, 2012, directed to U.S. Appl. No. 12/986,595; 9 pages.

* cited by examiner

*Primary Examiner* — Aneeta Yodichkas
(74) *Attorney, Agent, or Firm* — Morrison & Foerster LLP

(57) ABSTRACT

In the present invention, to improve CD read/write characteristics having poor image height characteristics, a third light emitting source emitting a third laser beam for CD is disposed on an optical axis of an objective lens. Thereby, the third laser beam emitted from the third light emitting source travels along the optical axis of the objective lens, thus generating no coma aberration in the third laser beam. Furthermore, in the present invention, a second light emitting source emitting a second laser beam for DVD and a first light emitting source emitting a first laser beam for BD are disposed across the third light emitting source. Thereby the phase propagation directions of coma aberrations in the first and second laser beams coincide with each other. Adjustment of the coma aberration in one of the laser beams enables the coma aberration in the other laser beam to be adjusted.

5 Claims, 8 Drawing Sheets

LIGHT EMITTING DEVICE, OPTICAL PICKUP APPARATUS AND METHOD FOR MANUFACTURING THE SAME

REFERENCE TO RELATED APPLICATIONS

This application is a divisional of U.S. patent application Ser. No. 12/986,595, filed Jan. 7, 2011, which claims priority from Japanese Application No. 2010-002702, filed Jan. 8, 2010, the entire contents of which are incorporated herein by reference.

BACKGROUND OF THE INVENTION

1. Field of the Invention

The present invention relates to a light emitting device irradiating multiple optical recording media with laser beams. The present invention also relates to an optical pickup apparatus including such a light emitting device, and a method for manufacturing the same.

2. Description of the Related Art

For optical pickup apparatuses compatible with multiple standards of optical recording media, various measures have been made for reduction in size and weight, and other purposes. For example, one of the measures is to employ an objective lens compatible with lasers of many wavelengths. Some of optical pickup apparatuses of this kind use a laser light source including laser diodes with multiple wavelengths as one package.

In the optical pickup apparatus thus configured, light emitting points of all the light emitting elements cannot be simultaneously arranged on an optical axis of the objective lens, leading to a problem of how to prevent coma aberration of the objective lens for the laser beams with the respective wavelengths. This technology is described for instance in Japanese Patent Application Publication No. 2009-170091.

SUMMARY OF THE INVENTION

Since the light emitting points emitting the laser beams are located at different positions, the optical pickup apparatus having the above configuration is designed with importance placed on optical characteristics for a predetermined optical recording medium, usually, a high-density optical recording medium. For this reason, the objective lens shows different image height characteristics among the laser beams of the respective wavelengths.

To be more specific, when comparison is made among a laser beam used for an optical disk of the CD standard (laser beam for CD), a laser beam used for an optical disk of the DVD standard (laser beam for DVD) and a laser beam used for an optical disk of the BD standard (laser beam for BD), the laser beam for CD has the worst image height characteristics because a cover layer covering an information recording layer is thicker than those in the other disks. Here, the image height characteristics are characteristics indicating the amount of coma aberration generated when the laser beam enters the objective lens at a slant.

Such poor image height characteristics of the laser beam for CD make it difficult to properly control the coma aberration in reading or writing on a CD by use of the laser beam focused by the objective lens, and thereby poses a problem of deterioration in skew characteristics.

When the laser beam for CD, the laser beam for DVD and the laser beam for BD enter the objective lens, coma aberrations are generated all in the laser beams. Here, a phase propagation direction of the coma aberration in the laser beam for DVD is opposite to those of the laser beam for CD and the laser beam for BD. Therefore, adjustment made to minimize the coma aberration in the laser beam for CD or the laser beam for BD increases the coma aberration in the laser beam for DVD, and thus causes a problem of deterioration in skew characteristics.

The present invention has been made in consideration of the foregoing problems. It is a main object of the present invention to provide a light emitting device capable of properly controlling coma aberration generated in multiple laser beams emitted. It is another object of the present invention to provide an optical pickup apparatus including such a light emitting device, and a method for manufacturing the same.

The present invention provides a light emitting device emitting a plurality of laser beams used for reading or writing on optical recording media through an objective lens, the light emitting device comprising: a first light emitting source configured to emit a first laser beam; a second light emitting source configured to emit a second laser beam having a wavelength longer than that of the first laser beam; and a third light emitting source configured to emit a third laser beam having a wavelength longer than those of the first and second laser beams, wherein the third light emitting source is disposed closest to an optical axis of the objective lens, the first light emitting source is disposed at one side of the third light emitting source, and the second light emitting source is disposed at the other side of the third light emitting source.

Moreover, the present invention provides an optical pickup apparatus applying a laser beam to an optical recording medium and detecting the laser beam reflected by the optical recording medium, comprising: a light emitting device according to the above configuration; a first light receiver configured to receive the first laser beam reflected by one of the optical recording media; and a second light receiver configured to receive the second laser beam and the third laser beam each reflected by one of the optical recording media.

Furthermore, the present invention provides a method for manufacturing an optical pickup apparatus, comprising: a first step of positioning a light emitting unit including a first light emitting chip emitting a first laser beam and a second light emitting chip emitting a second laser beam and a third laser beam which are different in wavelength from the first laser beam; a second step of preparing a first light receiver having a first light receiving region and a second light receiving region, and positioning the first light receiver so that the second laser beam is applied to the center of the first light receiving region and the third laser beam is applied to the center of the second light receiving region; and a third step of preparing a second light receiver having a third light receiving region separately from the first light receiver, and positioning the second light receiver so that the first laser beam is applied to the center of the third light receiving region.

According to the present invention, in the light emitting device emitting the first laser beam, the second laser beam having a wavelength longer than that of the first laser beam and the third laser beam having a wavelength longer than those of the first and second laser beams, the third light emitting source emitting the third laser beam compatible with a disk having the worst image height characteristics is disposed on the optical axis of the objective lens. This minimizes the amount of coma aberration generated in the third laser beam poor in image height characteristics, thereby optimizing the skew characteristics in the whole light emitting device even if a certain amount of coma aberration is generated in the other two laser beams.

Moreover, according to the present invention, the first light emitting source emitting the first laser beam is disposed to one side of the third light emitting source, and the second light emitting source emitting the second laser beam is disposed to the other side of the third light emitting source. In this way, in the case of a three-wavelength compatible objective lens having a characteristic that a phase direction of the coma aberration generated in the second laser beam is opposite to that of the coma aberration generated in the third laser beam, a phase direction of the coma aberration generated when the first laser beam passes through the objective lens coincides with the phase propagation direction of the coma aberration in the second laser beam. Accordingly, a relative inclination between the objective lens and the incident laser beam is adjusted so as to minimize the coma aberration in one of the first and second laser beams, thereby enabling correction to reduce the coma aberration in both of the laser beams.

Furthermore, the first light receiver is used to receive the first laser beam, and the second light receiver different from the first light receiver is used to receive the second and third laser beams. Accordingly, even if there occurs an error in a relative positional relationship between the first light emitting chip emitting the first laser beam and the second light emitting chip emitting the second and third laser beams, malfunction of the optical pickup apparatus due to the error is prevented by adjusting the positions of both the light receivers in the middle of the manufacturing process.

BRIEF DESCRIPTION OF THE DRAWINGS

FIG. 1A is a cross-sectional view thereof; FIG. 1B is an enlarged view of a portion in which light emitting chips are mounted.

FIG. 6A shows the entire optical pickup apparatus manufactured; FIG. 6B shows a second PDIC having its position adjusted in this step.

FIG. 7A shows the entire optical pickup apparatus manufactured; FIG. 7B shows the second PDIC having its position adjusted in this step.

FIG. 8A shows the entire optical pickup apparatus manufactured; FIG. 8B shows a first PDIC having its position adjusted in this step.

DESCRIPTION OF THE INVENTION

First Embodiment

Light Emitting Device

Figure 1A:
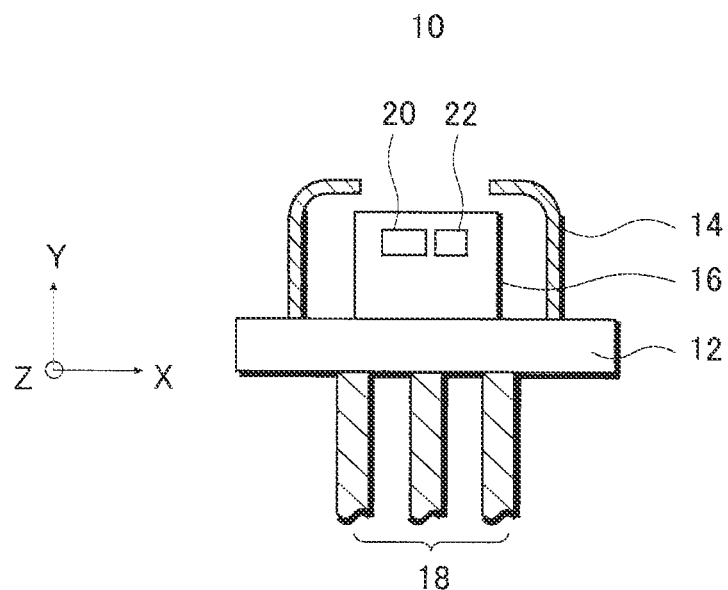
FIG. 1A and FIG. 1B are views showing a light emitting device of the present invention.
Figure 1B:
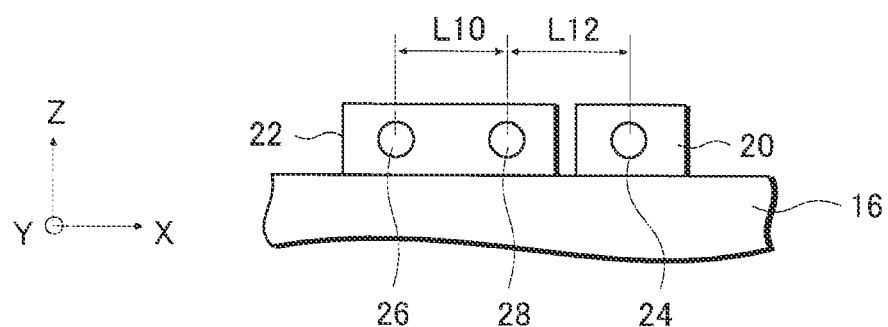

With reference to FIGS. 1A and 1B, a configuration of a light emitting device 10 of this embodiment will be described.

FIG. 1A is a cross-sectional view of the light emitting device 10 seen from the side, and FIG. 1B is a view of a portion in which light emitting chips are mounted, as seen from above the page.

Here, in this embodiment, description is given using X, Y and Z axes orthogonal to each other. The Y axis is an axis parallel to a travelling direction of a laser beam emitted from the light emitting device 10. The X axis is an axis parallel to a direction in which a first light emitting chip 20 and a second light emitting chip 22 are aligned. The Z axis is an axis in a direction vertically penetrating the page. Also, multiple light emitting points provided on both the light emitting chips are arranged on the Z-X plane.

With reference to FIG. 1A, the light emitting device 10 is a CAN type package, mainly including: an approximately disk-shaped base part 12; a plate-shaped stem 16 fixed to an upper surface of the base part 12; two light emitting chips (the first light emitting chip 20 and the second light emitting chip 22) mounted on the stem 16; a covering part 14 covering the light emitting chips; and a terminal part 18 which is electrically connected to the light emitting chips and is drawn to the outside. The light emitting device 10 has the CAN type configuration here, but a lead frame type may be adopted as the configuration of the light emitting device 10.

The light emitting device 10 emits a laser beam of a predetermined wavelength from the first light emitting chip 20 or the second light emitting chip 22 based on power supplied from the outside via the terminal part 18. The emitted laser beam is then emitted to the outside through an opening provided in the upper part of the covering part 14.

Furthermore, the light emitting device 10 emits three kinds of laser beams of different wavelengths to be used for reading or writing on each disk. To be more specific, the laser beams to be emitted include: a first laser beam used to read or write on a disk (optical recording medium) of the BD (Blu-ray Disc) standard or the HD-DVD (High-Definition Digital Versatile Disc) standard; a second laser beam used for a disk of the DVD (Digital Versatile Disc) standard; and a third laser beam used for a disk of the CD (Compact Disc) standard.

Here, the first laser beam is in a blue-violet wavelength range of 400 to 420 nm, the second laser beam is in a red wavelength range of 645 to 675 nm, and the third laser beam is in an infrared wavelength range of 765 to 805 nm.

With reference to FIG. 1B, the first light emitting chip 20 and the second light emitting chip 22 are mounted at a predetermined distance therebetween on a main surface of the stem 16.

The first light emitting chip 20 is a laser diode made of a semiconductor such as zinc selenide or gallium nitride, and is fixed to the upper surface of the stem 16 with a conductive adhesive such as conductive paste. A first light emitting source 24 is provided on an end face of the first light emitting chip 20, and the first laser beam is emitted from the first light emitting source 24.

The second light emitting chip 22 is a laser diode made of a semiconductor such as silicon, and is fixed to the upper surface of the stem 16 with a conductive adhesive as in the case of the first light emitting chip 20. Two light emitting sources (a second light emitting source 26 and a third light emitting source 28) are provided on the end face of the second light emitting chip 22. The second laser beam is emitted from the second light emitting source 26, and the third laser beam is emitted from the third light emitting source 28. A typical design value of a distance L10 between the second light emitting source 26 and the third light emitting source 28 is 110 μm, and the distance L10 ranges from 109 to 111 μm, for example, considering a manufacturing error (±1 μm). The second light emitting source 26 and the third light emitting source 28 are formed in the same second light emitting chip 22, and thus the distance L10 therebetween is very accurate.

The first and second light emitting chips 20 and 22 are fixed to the main surface of the stem 16 in a state where the end faces having the respective light emitting sources provided thereon face the Y direction. The end face of the first light emitting chip 20, on which the first light emitting source 24 is provided, and the end face of the second light emitting chip 22, on which the second and third light emitting sources 26 and 28 are provided, are arranged on the same plane. This arrangement equalizes the conditions of the respective laser beams emitted from the respective light emitting sources included in the light emitting device 10 (i.e., an amount of coma aberration and the like generated).

The first light emitting chip 20 is provided adjacent to the third light emitting source 28 side of the second light emitting chip 22. A design value of a distance L12 between the first light emitting source 24 provided on the first light emitting chip 20 and the third light emitting source 28 on the second light emitting chip 22 is 110 μm, which is the same as the distance L10. However, the accuracy of the distance depends on the accuracy of a bonder used to fix both the light emitting chips. Therefore, the distance L12 is less accurate than the distance L10 which depends on the accuracy of the front-end process (diffusion process), and includes an error of ±20 μm. To be more specific, the distance L12 ranges from 90 to 130 μm. Such poor accuracy of the distance L12 leads to a problem of how to arrange PDICs for receiving the laser beams emitted from the light emitting sources. An approach to this problem will be described later with reference to FIG. 4 and those subsequent thereto.

Figure 2:
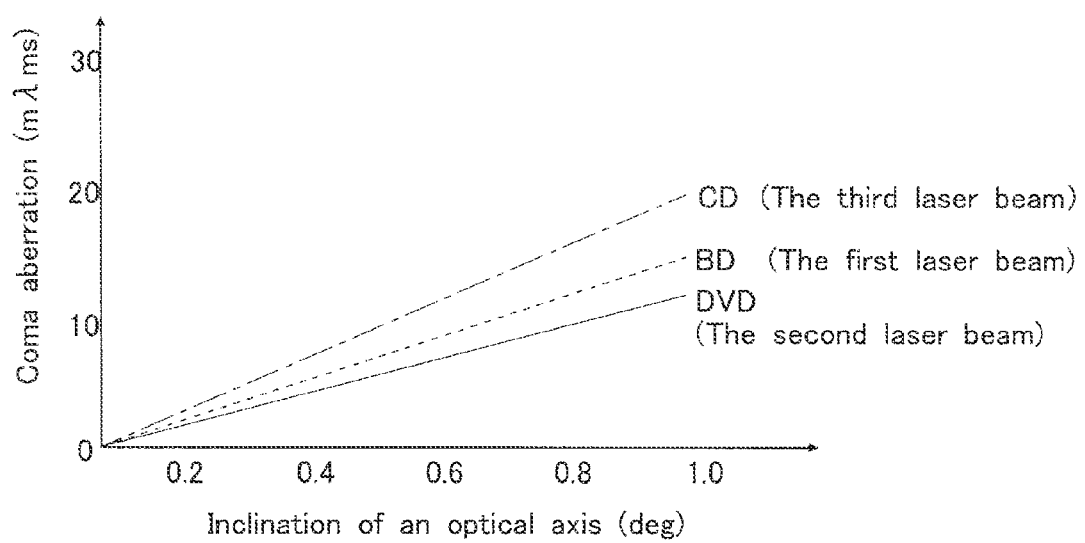
FIG. 2 is a graph showing a correlation between inclination of an optical axis and an amount of coma aberration generated in each of laser beams applied to a BD, a DVD and a CD.

With reference to FIG. 2, description is given of image height characteristics of the laser beams emitted from the respective light emitting sources described above. The horizontal axis of the graph shown in FIG. 2 represents a tilt angle of each of the laser beams relative to an optical axis of an objective lens, while the vertical axis represents an amount of coma aberration generated due to the inclination. Here, the image height characteristics mean the amount of coma aberration generated due to the inclination of the optical axis. The smaller the amount of coma aberration, the better the image height characteristics; the larger the amount of coma aberration, the poorer the image height characteristics.

As is clear from this graph, the amount of coma aberration is largest in the third laser beam used to read and write on a CD, is second largest in the first laser beam used for a BD, and is smallest in the second laser beam used for a DVD. This shows that the CD has the poorest image height characteristics.

In this embodiment, with reference to FIG. 1B, the light emitting device 10 includes the three light emitting sources emitting the laser beams conforming to the three disk standards (BD, DVD and CD), and the laser beams emitted from the three light emitting sources are focused on signal recording surfaces of the disks with one objective lens. Therefore, when any one of the three light emitting sources is disposed on the optical axis of the objective lens, the other two light emitting sources are shifted from the optical axis. The laser beams emitted from these other two light emitting sources enter the objective lens at a slant, resulting in generation of the coma aberration.

In this case, for example, when the first light emitting source 24 emitting the first laser beam for BD is disposed on the optical axis and the second light emitting source 26 for DVD and the third light emitting source 28 for CD are disposed while being shifted from the optical axis, a large coma aberration is generated in the third laser beam emitted from the third light emitting source 28 for CD. Accordingly, the characteristics are deteriorated when CD read or write is performed using the third laser beam emitted from the light emitting device 10.

In this embodiment, in order to ensure read or write characteristics of the CD poor in image height characteristics, the third light emitting source 28 emitting the third laser beam for CD is disposed on the optical axis of the objective lens. In this way, assuming an ideal objective lens which does not have in itself any factor that causes coma aberration, when the objective lens is in its initial position without being tracking driven, the third laser beam emitted from the third light emitting source 28 passes on the optical axis of the objective lens, thus generating no coma aberration in the third laser beam. Furthermore, even if a relative positional error is generated between the light emitting device 10 and the objective lens when the light emitting device 10 is positioned and fixed in the optical pickup apparatus, misalignment between the third light emitting source 28 and the optical axis of the objective lens is within the range of the positional error. As a result, the amount of coma aberration generated due to the error turns out to be as small as not affecting the characteristics of the entire device.

With reference to FIGS. 3A to 3F, description is given of characteristics of coma aberration generated when each of the laser beams passes through the objective lens. Here, the first to third laser beams are made incident at the same tilt angle on an objective lens as an example, which is designed to be compatible with three wavelengths corresponding to the wavelengths of the respective laser beams, and then the amount of coma aberration generated in each of the laser beams transmitted through the objective lens is measured.

Figure 3A:
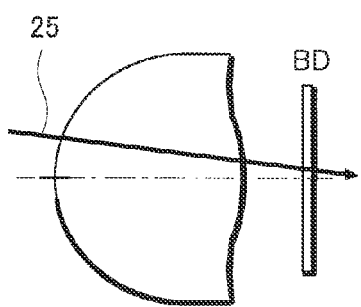
FIGS. 3A and 3B are views showing coma aberration generated in a first laser beam used for the BD.
Figure 3B:
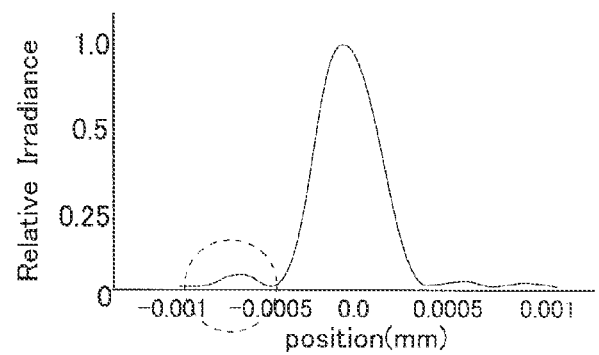
Figure 3C:
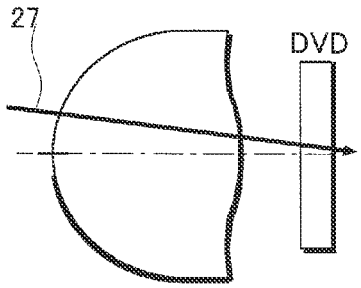
FIGS. 3C and 3D are views showing coma aberration generated in a second laser beam used for the DVD.
Figure 3D:
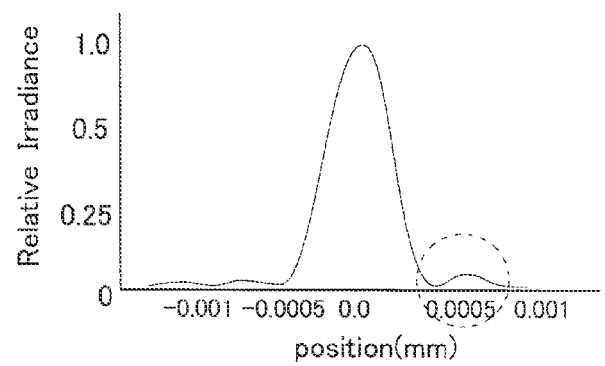
Figure 3E:
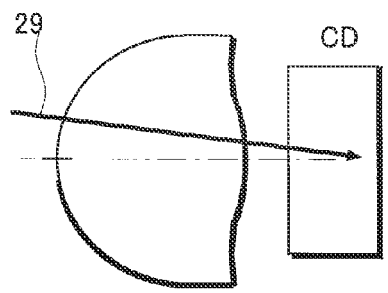
FIGS. 3E and 3F are views showing coma aberration generated in a third laser beam used for the CD.
Figure 3F:
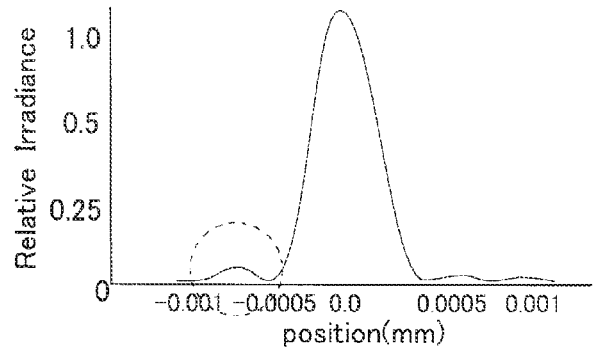

FIG. 3A is a cross-sectional view showing a situation where the first laser beam 25 used for BD read or write enters the objective lens at a slant, and FIG. 3B is a graph showing a phase direction of coma aberration generated in the first laser beam 25. FIG. 3C is a cross-sectional view showing a situation where the second laser beam used for DVD enters the objective lens, and FIG. 3D is a graph showing a phase direction of coma aberration generated in the second laser beam. FIG. 3E is a cross-sectional view showing a situation where the third laser beam 29 used for CD enters the objective lens, and FIG. 3F is a graph showing a phase direction of coma aberration generated in the third laser beam. Here, the optical axis of the objective lens is indicated by the dashed line in FIG. 3A and the like. The horizontal axis of the graph shown in FIG. 3B and the like represents a spot onto which the laser beam is applied, while the vertical axis represents relative intensity of the laser beam applied onto that spot.

Here, the coma aberration means a phenomenon that focuses of the laser beam passing through a portion near the optical axis of the objective lens and of the laser beam passing through a portion distant from the optical axis are shifted from each other. The amount of coma aberration means this shift amount. Furthermore, the coma aberration is generated when the laser beam enters the optical axis of the objective lens at a slant as shown in FIG. 3A and the like, and basically no coma aberration is generated in the laser beam passing on the optical axis.

Meanwhile, in the case of an actual objective lens, coma aberration is generated depending on formation accuracy and distortion of the objective lens itself or adjustment accuracy for installation thereof into a lens holder. As a result, this coma aberration is added to the coma aberration generated when the laser beam enters the optical axis of the objective lens at a slant.

In FIGS. 3A to 3F, in the case of the objective lens in which the amount of coma aberration generated in each of the laser beams is measured, when the first laser beam 25 for BD enters the objective lens at a slant, the phase of the coma aberration generated propagates toward the "negative side" as shown in FIGS. 3A and 3B.

When the second laser beam 27 for DVD enters the objective lens at a slant, the phase of the coma aberration propagates toward the "positive side" as shown in FIGS. 3C and 3D. In other words, the phase propagation direction of the coma aberration generated in the second laser beam is opposite to that of the first laser beam.

When the third laser beam 29 for CD enters the objective lens at a slant, coma aberration is generated whose phase propagates toward the negative side, as shown in FIGS. 3E and 3F. In other words, the phase propagation direction of the coma aberration generated in the third laser beam 29 is the same as that of the first laser beam 25, and is opposite to that of the second laser beam 27.

When, for example, with reference to FIG. 1B, the first light emitting source 24, the second light emitting source 26 and the third light emitting source 28 are randomly arranged and a relative positional relationship between the objective lens (not shown) and the light emitting device 10 is adjusted so as to minimize the coma aberration in the first light emitting source 24 for BD, the coma aberration generated in the second laser beam emitted from the second light emitting source 26 for DVD is increased. This is because the first laser beam for BD and the second laser beam for DVD differ from each other in the phase propagation direction of the coma aberration as described above. At the same time, when a positional adjustment is made so as to minimize the coma aberration in the second laser beam emitted from the second light emitting source 26 for DVD, the amount of coma aberration generated in the first laser beam emitted from the first light emitting source 24 for BD is increased.

In this embodiment, in order to reduce the coma aberration with good balance as a whole, the third light emitting source 28 for CD is disposed in the middle of the optical axis, and the second light emitting source 26 and the first light emitting source 24, which are opposite to each other in the phase propagation direction of the coma aberration in the laser beam emitted, are disposed at positions sandwiching the third light emitting source 28. To be more specific, with reference to FIG. 1B, the first light emitting source 24 is disposed to the right of the third light emitting source 28, and the second light emitting source 26 is disposed to the left of the third light emitting source 28. Such an arrangement is realized by adjacently disposing the first light emitting chip 20 including the first light emitting source 24 and the second light emitting chip 22 including the second and third light emitting sources 26 and 28.

Furthermore, in this embodiment, the second light emitting source 26 and the first light emitting source 24 are arranged symmetrically in the X direction about the third light emitting source 28. To be more specific, the first light emitting source 24 is distant by L12 (110 μm) from the third light emitting source 28 in the X direction, while the second light emitting source 26 is distant by L10 (110 μm) from the third light emitting source 28 in the X direction. Note that the symmetrical arrangement includes not only an absolutely symmetrical arrangement but also the case where the light emitting sources are arranged in symmetrical positions including a manufacturing error of about several ten μm (e.g., ±20 μm).

Thus, the first laser beam emitted from the first light emitting source 24 and the second laser beam 27 emitted from the second light emitting source 26 are emitted in the directions (opposite directions) crossing each other on the extensions of both the laser beams. As a result, the phase propagation directions of the coma aberrations in both the laser beams are set to be the same direction.

In the step of mounting the light emitting device 10 in the optical pickup apparatus, angles and positions of the light emitting device 10 and the objective lens are adjusted so as to minimize the amount of coma aberration in the first laser beam emitted from the first light emitting source 24 for BD, thereby correcting at the same time the coma aberration in the second laser beam emitted from the second light emitting source 26 for DVD to be small. Note that since the third light emitting source 28 for CD is disposed on the optical axis of the objective lens, the amount of coma aberration included in the third laser beam emitted from the third light emitting source 28 is very small.

Here, with reference to FIG. 1B, in the above description, the second light emitting source 26 and the first light emitting source 24 are arranged symmetrically about the third light emitting source 28. However, both the light emitting sources do not always have to be symmetrically arranged. In other words, even if the distances L10 and L12 described above are different from each other, the above effect can be achieved by disposing both the light emitting sources so that they sandwich the third light emitting source 28.

Second Embodiment

Optical Pickup Apparatus

Figure 4:
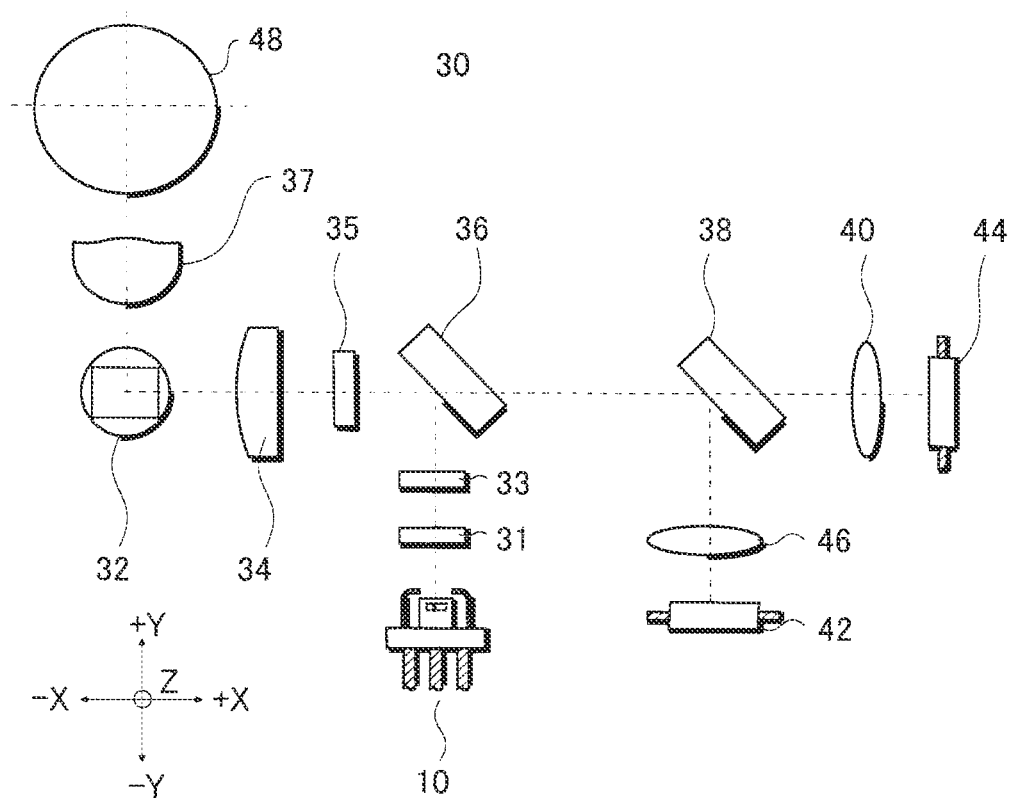
FIG. 4 is a view showing a structure of an optical pickup apparatus of the present invention.

In this embodiment, with reference to FIG. 4, description is given of a structure of an optical pickup apparatus 30 including the light emitting device 10 described in the first embodiment.

The optical pickup apparatus 30 is, in general, an apparatus for applying a laser beam to a rotating disk 48 (optical recording medium) and detecting the laser beam reflected by the disk 48, and is used as mounted on an information recorder/reproducer such as a disk reproducer.

The optical pickup apparatus 30 mainly includes: a light emitting device 10 configured to emit three kinds of laser beams having different wavelengths; a first PDIC 42 configured to detect a laser beam of the BD standard; a second PDIC 44 configured to detect laser beams of the CD standard and the DVD standard; and various optical elements disposed on optical paths thereamong. The respective optical elements shown in FIG. 4 are included in a housing formed by injection molding magnesium and the like. Note that PD stands for Photo Detector, i.e., photodetector.

As described with reference to FIG. 1B, in this embodiment, two light emitting elements (the first light emitting chip 20 and the second light emitting chip 22) are provided in a hybrid manner inside the light emitting device 10. Furthermore, in this embodiment, the first PDIC 42 detects a laser beam emitted from the first light emitting chip 20, and the second PDIC 44 detects a laser beam emitted from the second light emitting chip 22. That is, the optical pickup apparatus 30 includes: a first optical system through which the laser beam of the BD standard emitted from the light emitting device 10 passes; and a second optical system through which the laser beams of the CD standard and the DVD standard emitted from the light emitting device 10 pass.

The respective elements included in the optical pickup apparatus 30 are described in detail below.

As described above in the first embodiment, the light emitting device 10 emits three laser beams (first, second and third laser beams) for recording information on and reproducing information from disks of the BD standard, DVD standard and CD standard.

A diffraction grating 31 has a function to split the laser beam emitted from the light emitting device 10 into 0-order diffracted light, +1-order diffracted light and −1-order diffracted light.

A half-wavelength plate 33 converts the laser beam made incident after passing through the diffraction grating 31 into a linearly-polarized laser beam polarized in a predetermined direction (e.g., S direction).

A semitransparent mirror 36 reflects toward the −X side the laser beam emitted from the light emitting device 10 and made incident after passing through the diffraction grating 31 and the like, and transmits the laser beam (return light) reflected by the disk 48 to the +X side. The return light reflected by the disk 48 is light linearly polarized in a P direction, which is obtained by converting the return light once into circularly-polarized light by the action of a quarter wavelength plate and then converting the light back into linearly-polarized light. Thus, the return light is transmitted in the +X direction.

A quarter wavelength plate 35 converts the linearly-polarized light into circularly-polarized light and, in reverse, converts the circularly-polarized light into linearly-polarized light. That is, the laser beam emitted from the light emitting device 10 is converted into circularly-polarized light while travelling in the −X direction. Furthermore, the laser beam reflected by the disk 48 is converted from circularly-polarized light into linearly-polarized light by passing through the quarter wavelength plate 35 in the +X direction. Note that when the laser beam passes again through the quarter wavelength plate 35, the laser beam is converted not into the original light linearly polarized in the S direction but into light linearly polarized in the P direction.

A collimator lens 34 converts the laser beam reflected by the semitransparent mirror 36 into parallel light, and is provided to be displaceable in the X direction. This enables correction of deterioration in optical characteristics of an objective lens 37 due to a temperature change, and also allows spherical aberration to be corrected, which is caused by a difference in thickness of a cover layer covering an information recording layer of the disk 48 or a difference in cover thickness among information recording layers in an optical recording medium having a multilayer structure.

A reflecting mirror 32 has a function to receive the laser beam transmitted through the collimator lens 34 and to reflect the laser beam travelling in the −X direction toward the +Y direction.

The objective lens 37 is disposed immediately above the reflecting mirror 32 and has a function to focus the laser beam sent up in the Y direction by the reflecting mirror 32 on a signal recording surface of the disk 48. In this embodiment, the objective lens 37 is used in common for the first, second and third laser beams used for recording on and reproducing from the BD, DVD and CD.

A dichroic mirror 38 reflects a laser beam having a specific wavelength and transmits laser beams having other wavelengths. In this embodiment, the dichroic mirror 38 transmits the second and third laser beams used for the DVD and CD, and reflects the first laser beam used for the BD.

An anamorphic lens 40 gives astigmatism to the second and third laser beams used for the DVD and CD. Moreover, an anamorphic lens 46 gives astigmatism to the first laser beam used for the BD.

The first PDIC 42 is a photodiode integrated circuit element for signal detection, which serves as a photodetector, detects the first laser beam for BD, and is used for focus servo and tracking servo.

The second PDIC 44 performs signal detection for the second and third laser beams for DVD and CD, and is used for focus servo and tracking servo.

The disk 48 is an optical recording medium having a signal recording surface covered with a resin layer having a predetermined thickness. For the disk 48, a disk of the BD standard, a disk of the DVD standard or a disk of the CD standard is adopted.

Next, description is given of read and write operations by the optical pickup apparatus thus configured.

First, an operation of the first optical system through which the first laser beam for BD passes is described. The first laser beam emitted from the first light emitting source 24 (see FIG. 1B) in the light emitting device 10 is split into 0-order diffracted light, +1-order diffracted light and −1-order diffracted light by passing through the diffraction grating 31. This is in order to perform tracking servo by the first PDIC 42.

The first laser beam is further converted into linearly polarized light polarized in a predetermined direction by passing through the half-wavelength plate 33. For example, here, the first laser beam is converted into light linearly polarized in the S direction.

The first laser beam converted into the light linearly polarized in the S direction is reflected in the −X direction by the semitransparent mirror 36 and then converted into circularly polarized light by passing through the quarter wavelength plate 35.

Thereafter, the first laser beam converted into the circularly polarized light is converted into parallel light by the collimator lens 34, is reflected by the reflecting mirror 32 to travel in a direction perpendicular to the disk 48 (i.e., +Y direction), and is focused on the signal recording surface of the disk 48 by refraction or diffraction action of the objective lens 37.

The first laser beam (return light) reflected by the signal recording surface of the disk 48 reaches the semitransparent mirror 36 after passing through the objective lens 37, the reflecting mirror 32, the collimator lens 34 and the quarter wavelength plate 35. Here, the first laser beam that is the return light is converted from the circularly polarized light into the light linearly polarized in the P direction when passing through the quarter wavelength plate 35. Accordingly, the first laser beam that is the light linearly polarized in the P direction is transmitted through the semitransparent mirror 36 and travels in the +X direction.

The first laser beam transmitted through the semitransparent mirror 36 is reflected in the −Y direction by the dichroic mirror 38, is given aberration by the anamorphic lens 46, and then reaches the first PDIC 42. Furthermore, information is read out by the first PDIC 42, and focus servo and tracking servo are performed.

Next, description is given of an operation of the second optical system through which the second laser beam for DVD passes. An operation in which the second laser beam is emitted from the second light emitting source 26 (see FIG. 1B) included in the light emitting device 10 and reaches the dichroic mirror 38 through the various optical elements and the disk 48 is the same as that for the first laser beam described above.

The second laser beam is not reflected by but transmitted through the dichroic mirror 38, is given aberration by the anamorphic lens 40, and is then applied to the surface of the second PDIC 44. As in the case of the first PDIC 42, information is read out by the second PDIC 44, and focus servo and tracking servo are performed.

Meanwhile, an operation of the third laser beam for CD emitted from the third light emitting source 28 in the light emitting device 10 is the same as that of the second laser beam for DVD.

The gist of this embodiment is to provide two PDICs.

In principle, it is also possible for one PDIC to detect three laser beams different in wavelength emitted from one light emitting device 10. However, with reference to FIG. 1B, in this embodiment, all the light emitting sources are not monolithically formed in one chip but provided in a hybrid manner in separate chips. To be more specific, the first light emitting source 24 emitting the laser beam for BD is provided in the first light emitting chip 20, while the second light emitting source emitting the second laser beam for DVD and the third light emitting source 28 emitting the third laser beam for CD are provided in the second light emitting chip 22. The positional accuracy of both the light emitting chips provided in the hybrid configuration includes an error of ±20 μm in the X direction. Therefore, when one PDIC tries to receive all of the three laser beams emitted from the light emitting device 10, the laser beams are not properly applied to a light receiving region of the PDIC due to the poor positional accuracy, resulting in a possibility that signal detection or each servo mechanism cannot be properly executed.

To avoid this, in this embodiment, two PDICs (the first PDIC 42 and the second PDIC 44) are provided, and the first laser beam for BD is detected by the first PDIC 42 and the second laser beam for DVD and the third laser beam for CD are detected by the second PDIC 44. To be more specific, the first laser beam as the return light reflected by the disk 48 is reflected in the –Y direction by the dichroic mirror 38 and then detected by the first PDIC 42. Furthermore, the second and third laser beams as the return light reflected by the disk 48 are transmitted through the dichroic mirror 38 and then detected by the second PDIC 44.

In this way, even if the first and second light emitting chips 20 and 22 shown in FIG. 1B are disposed having their relative positions shifted from each other in the light emitting device 10 emitting the respective laser beams, the laser beams are properly applied to the light receiving regions of the respective PDICs by correcting the positions of the first and second PDICs 42 and 44. The position correction of the PDICs will be described in detail later as one of the steps in the manufacturing method.

Third Embodiment

Method for Manufacturing Optical Pickup Apparatus

With reference to FIGS. 5 to 8, description is given of a method for manufacturing the optical pickup apparatus having the configuration described in the second embodiment.

Figure 5:
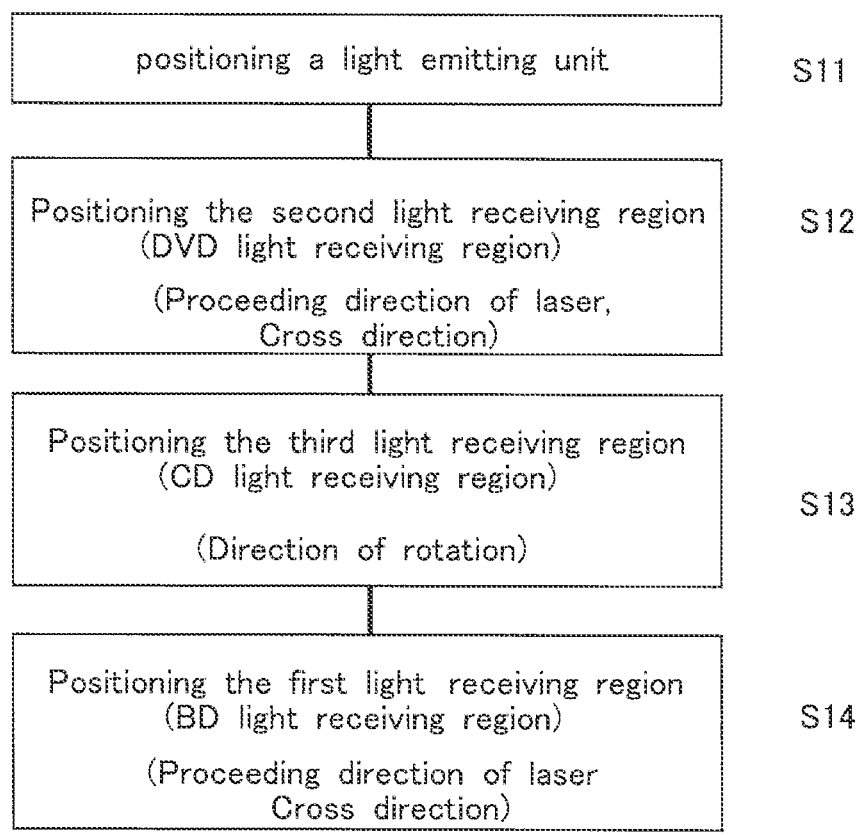
FIG. 5 is a flowchart showing a method for manufacturing an optical pickup apparatus of the present invention.

With reference to FIG. 5, the method for manufacturing the optical pickup apparatus according to this embodiment mainly includes: a first step S11 of positioning a light emitting unit; a second step S12 of positioning a second light receiving region (DVD light receiving region) included in the second PDIC 44; a third step S13 of positioning a third light receiving region (CD light receiving region) included in the second PDIC 44; and a fourth step S14 of positioning a first light receiving region (BD light receiving region) included in the first PDIC 42.

Here, the first PDIC 42 described above is for detecting the first laser beam for BD, and the second PDIC 44 is for detecting the second laser beam for DVD and the third laser beam for CD.

Although the chart shown in FIG. 5 shows only the positioning of the light receiving regions included in the respective PDICs, the manufacturing method of this embodiment also includes the steps of providing elements other than the PDICs in an unillustrated housing and of positioning those elements.

Figure 6A:
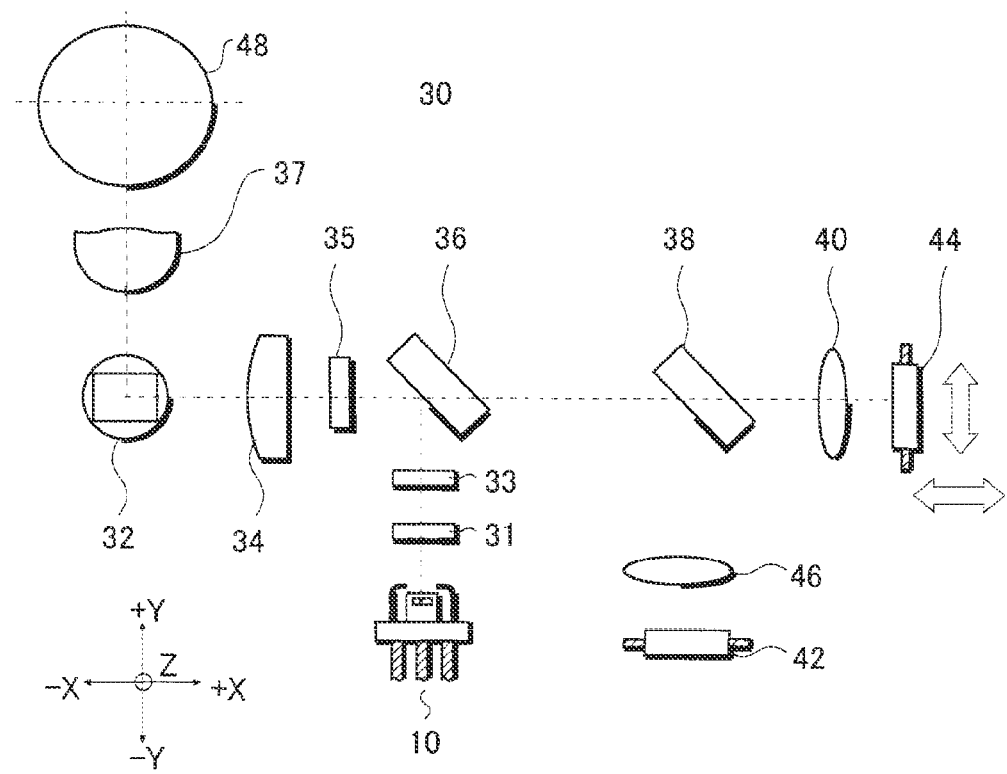
FIGS. 6A and 6B are views showing the method for manufacturing an optical pickup apparatus of the present invention.

First, in Step S11, with reference to FIG. 6A, the light emitting device 10 emitting three laser beams is adjusted for its position and then fixed.

Figure 6B:
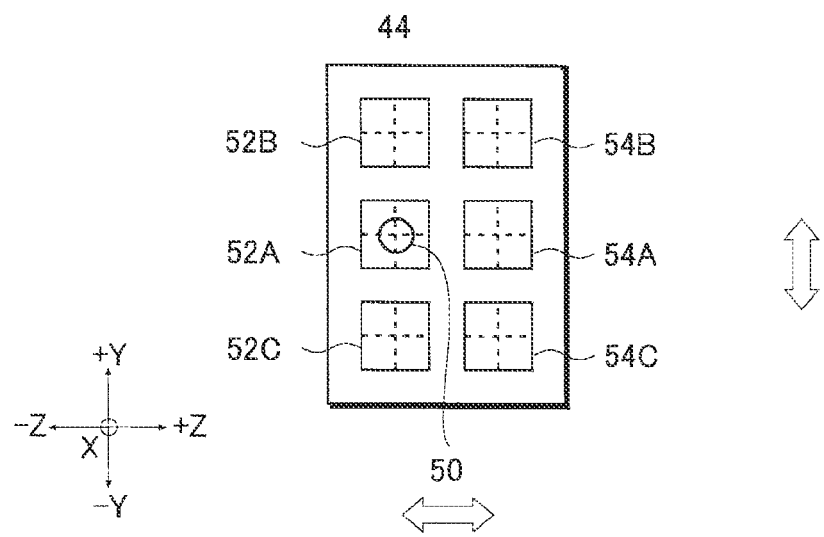

Next, with reference to FIGS. 6A and 6B, positioning of the second light receiving region (DVD light receiving region) described above is performed (Step S12). FIG. 6A is a view showing the entire optical pickup apparatus 30 in this step, while FIG. 6B is a plan view of the second PDIC 44 seen from the –X direction.

First, with reference to FIG. 6A, the various optical elements included in the optical pickup apparatus 30 are provided at predetermined positions, and their positions are fixed. To be more specific, the objective lens 37, the reflecting mirror 32, the collimator lens 34, the quarter wavelength plate 35, the semitransparent mirror 36, the half-wavelength plate 33, the diffraction grating 31, the light emitting device 10, the dichroic mirror 38, and the anamorphic lenses 40 and 46 are adjusted for their positions and then fixed.

In this embodiment, after positioning and fixing the optical elements, the light receiving regions included in the first and second PDICs 42 and 44 are aligned, thereby positioning and fixing both the PDICs.

First, with reference to FIG. 6B, the second PDIC 44 has a function to receive the second laser beam for DVD and the third laser beam for CD to perform signal detection, tracking servo and focus servo for the respective laser beams.

As a specific configuration, the second PDIC 44 includes three light receiving regions (52A, 52B and 52C) for receiving the second laser beam for DVD and three light receiving regions (54A, 54B and 54C) for receiving the third laser beam for CD.

The DVD light receiving regions 52A, 52B and 52C receive three second laser beams (0-order diffracted light, +1-order diffracted light and –1-order diffracted light) diffracted by the diffraction grating 31, respectively. Each of the light receiving regions includes four photodiodes split-arranged in a grid pattern.

The servo performed using the PDIC includes focus servo for focusing in a direction perpendicular to the recording surface of the disk and tracking servo for radial alignment to follow a recording track of the disk. For the focus servo, an astigmatic method or a differential astigmatic method can be adopted. For the tracking servo, a push-pull method, a differential push-pull method, in-line DPP, a DPP method or a three-beam method can be adopted.

In this embodiment, the differential push-pull method is adopted for the tracking servo, and the differential astigmatic method is adopted for the focus servo. It is preferable in this step that each of the laser beams is positioned at the center of each of the light receiving regions even when any of the methods described above is adopted.

Such a configuration is adopted also for the CD light receiving regions (54A, 54B and 54C) provided adjacent to the DVD light receiving regions on the main surface of the same second PDIC 44.

In this step, with reference to FIG. 6A, the light receiving regions included in the second PDIC 44 for detecting the second laser beam for DVD are aligned on the Z-Y plane. To be more specific, first, the second laser beam for DVD is emitted from the light emitting device 10 fixed in a predetermined position. The second laser beam emitted reaches the signal recording layer of the disk 48 after passing through the diffraction grating 31 and the half-wavelength plate 33, being reflected by the semitransparent mirror 36, and then passing through the quarter wavelength plate 35, the collimator lens 34, the reflecting mirror 32 and the objective lens 37. Moreover, the second laser beam as return light reflected by the signal recording layer of the disk 48 passes through the objective lens 37, the reflecting mirror 32, the collimator lens 34 and the quarter wavelength plate 35. Furthermore, the second laser beam as the return light is transmitted through the semitransparent mirror 36 and reaches the second PDIC 44 after passing through the dichroic mirror 38 and the anamorphic lens 40.

FIG. 6B shows a DVD main beam 50 by a circle, which is 0-order diffracted light of the second laser beam applied to the DVD light receiving region 52A of the second PDIC 44. In this step, the position of the second PDIC 44 on the Z-Y plane is adjusted so that the DVD main beam 50 is applied in this state to the center position of the DVD light receiving region 52A. At the same time, the position of the second PDIC 44 on the Z-Y plane is adjusted so that the +1-order diffracted light of the second laser beam is applied to the center of the DVD light receiving region 52B and the −1-order diffracted light of the second laser beam is applied to the center of the DVD light receiving region 52C. This is for the tracking servo and/or focus servo.

Furthermore, in this step, the position of the second PDIC 44 in the X direction (travelling direction of the second laser beam) is adjusted so that the DVD main beam 50 applied to the center of the DVD light receiving region 52A has a true circular shape or a shape close thereto. In this way, the +1-order diffracted light applied to the DVD light receiving region 52B and the −1-order diffracted light applied to the DVD light receiving region 52C also have the true circular shape or the shape close thereto.

By adjusting the position of the second PDIC 44 in the X direction so that the DVD main beam 50 has the true circular shape, the third laser beam applied to the CD light receiving region 54A or the like also has a shape close to the true circle. This saves the trouble of performing position adjustment in the X direction individually for the CD light receiving region 54A and the like.

Figure 7A:
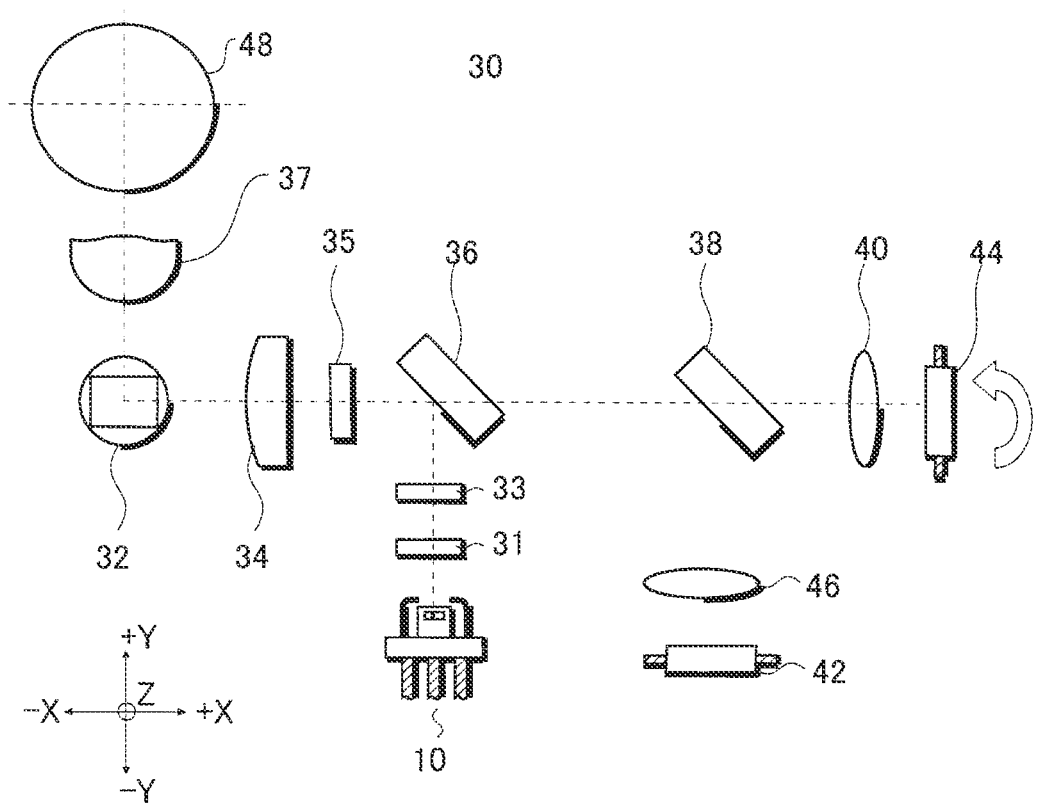
FIGS. 7A and 7B are views showing the method for manufacturing an optical pickup apparatus of the present invention.
Figure 7B:
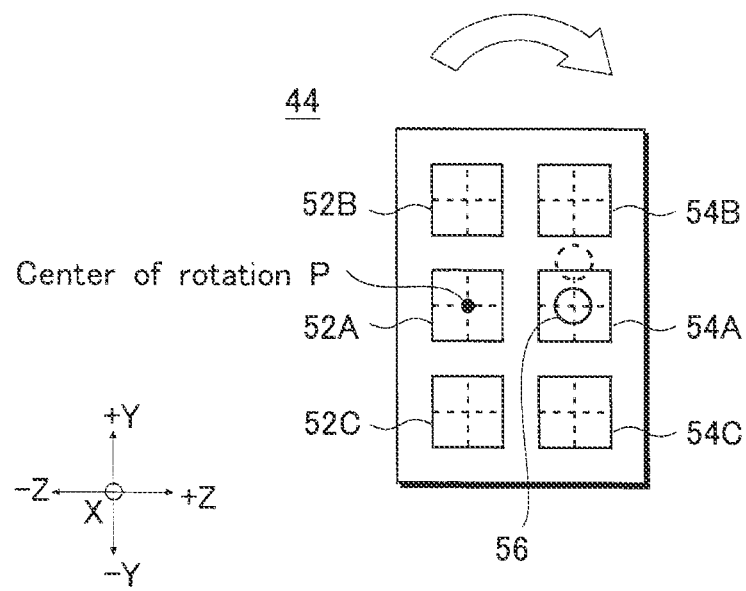

Next, with reference to FIGS. 7A and 7B, description is given of the step of positioning the third light receiving regions (CD light receiving regions) (S13). The states shown in FIGS. 7A and 7B are the same as those shown in FIGS. 6A and 6B.

With reference to FIG. 7A, in this step, the third laser beam for CD is emitted from the light emitting device 10 and is allowed to reach the second PDIC 44 after passing through the respective optical elements. Then, rotational positioning of the second PDIC 44 is performed in this state.

To be more specific, with reference to FIG. 7B, the second PDIC 44 is rotated around the center of the DVD light receiving region 52A receiving the DVD main beam positioned in the previous step, so that a CD main beam 56 (0-order diffracted light of the third laser beam) is applied to the center of the CD light receiving region 54A. In FIG. 7B, the spot to which the CD main beam 56 is applied before the rotational adjustment is performed is indicated by the dotted line, while the state where the CD main beam 56 is applied to the CD light receiving region 54A after the rotational adjustment is properly performed is indicated by the solid line with hatching.

As described above, the two light emitting sources emitting the second laser beam for DVD and the third laser beam for CD are monolithically formed in one light emitting chip as shown in FIG. 1B with good positional accuracy. At the same time, the relative positional accuracy of the respective light receiving regions formed in one second PDIC 44 is also high. Accordingly, the rotational adjustment in this step allows the positions of the five light receiving regions other than the DVD light receiving region 52A to be properly corrected. That is, in a situation where the optical pickup apparatus 30 is properly operated, circular laser beams are applied to center portions of all the light receiving regions.

Figure 8A:
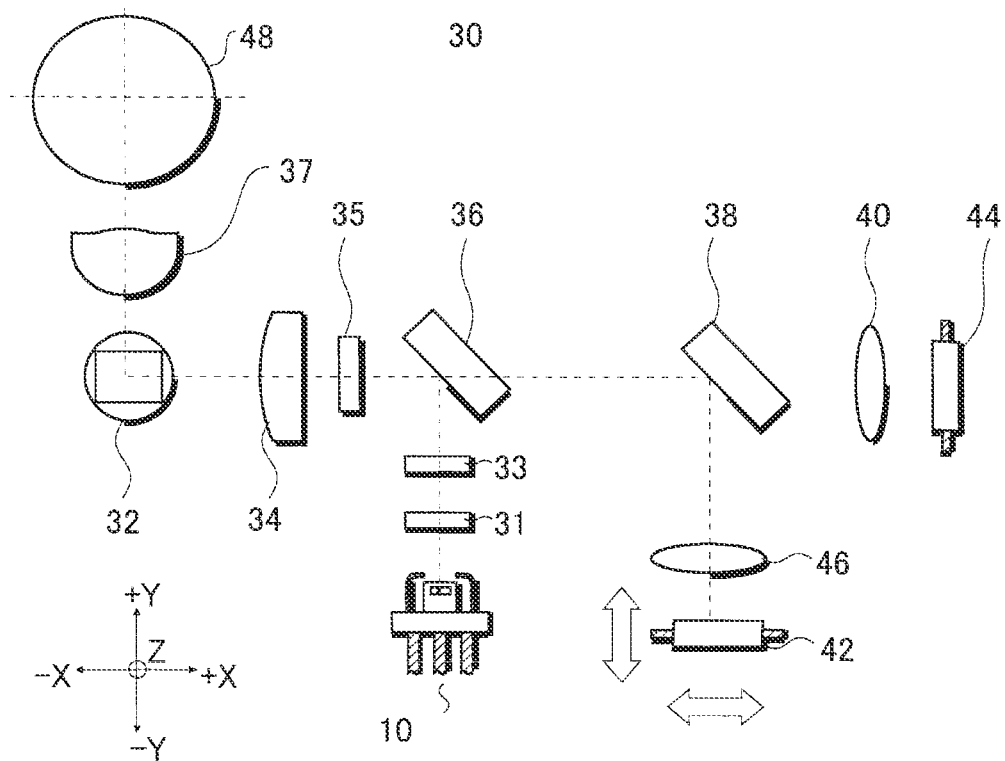
FIGS. 8A and 8B are views showing the method for manufacturing an optical pickup apparatus of the present invention.
Figure 8B:
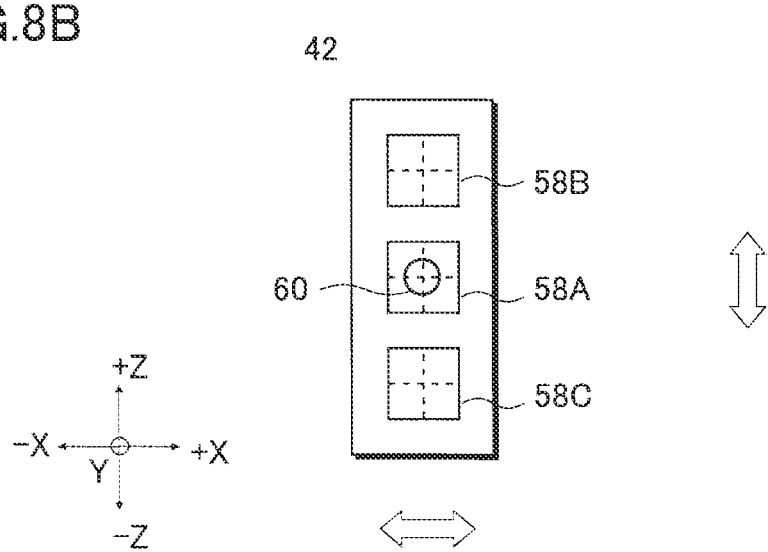

With reference to FIGS. 8A and 8B, position adjustment of the first PDIC 42 for detecting the laser beam for BD is performed next (S14). FIG. 8A is a view showing a state of the optical pickup apparatus 30 in this step, while FIG. 8B is a plan view of the first PDIC 42 seen from the +Y direction.

To be more specific, first, the first laser beam for BD is emitted from the first light emitting chip 20 (see FIG. 1B) in the light emitting device 10. The first laser beam emitted reaches the signal recording surface of the disk 48 after passing through the diffraction grating 31, the half-wavelength plate 33, the semitransparent mirror 36, the quarter wavelength plate 35, the collimator lens 34, the reflecting mirror 32 and the objective lens 37. The first laser beam that has become return light after being reflected by the signal recording surface of the disk 48 passes through the objective lens 37, the reflecting mirror 32, the collimator lens 34 and the quarter wavelength plate 35, and is then transmitted through the semitransparent mirror 36 to reach the dichroic mirror 38. The dichroic mirror 38 transmits the laser beam for DVD or CD and also reflects the first laser beam for BD. Accordingly, the first laser beam is reflected in the −Y direction by the dichroic mirror 38, is given aberration by the anamorphic lens 46, and is then applied to the light receiving surface of the first PDIC 42. In this step, position adjustment of the first PDIC 42 is performed while the first laser beam is applied to the first PDIC 42 as described above.

With reference to FIG. 8B, in the first PDIC 42, three BD light receiving regions (58A, 58B and 58C) are provided, which receive 0-order diffracted light, +1-order diffracted light and −1-order diffracted light of the first laser beam diffracted by the diffraction grating 31. Each of the BD light receiving regions includes four photodiodes split into a grid pattern.

In this step, the position adjustment of the first PDIC 42 is performed so that a BD main beam 60 that is 0-order diffracted light of the first laser beam has an approximately circular shape in the center portion of the BD light receiving region 58A. Here, the position adjustment of the first PDIC 42 includes position adjustment along the Y direction that is the travelling direction of the first laser beam and position adjustment on the X-Z plane that is the plane on which all the light receiving regions are arranged. Such position adjustment enables good signal processing to be performed for the first laser beam used for the BD by the first PDIC 42, and also enables focus servo and tracking servo to be successfully performed.

With reference to FIG. 1B, the positional accuracy of the first light emitting chip 20 emitting the laser beam for BD and the second light emitting chip 22 emitting the second laser beam for DVD and the third laser beam for CD includes a relatively large error. For this reason, positional accuracy between the laser beams emitted from the light emitting chips is not good either. When one PDIC tries to detect all the laser beams emitted from both the chips, there is a possibility that the position adjustment with one PDIC cannot correct the poor positional accuracy between the laser beams. In this embodiment, the laser beams emitted from the first and second light emitting chips 20 and 22 are detected individually by the first and second PDICs 42 and 44, and position adjustment is performed for each of the PDICs. In this way, the three kinds of laser beams emitted from the light emitting device 10 can be accurately detected, and the servo mechanism can be properly operated.

What is claimed is:

1. An optical pickup apparatus applying a laser beam to an optical recording medium and detecting the laser beam reflected by the optical recording medium, comprising:
    a light emitting device emitting a plurality of laser beams used for reading or writing in optical recording media through an objective lens, the light emitting device comprising,
        a first light emitting source configured to emit a first laser beam,
        a second light emitting source configured to emit a second laser beam having a wavelength longer than a wavelength of the first laser beam, and
        a third light emitting source configured to emit a third laser beam having a wavelength longer than the wavelength of the second laser beam,
        wherein the third light emitting source is disposed closest to an optical axis of the optical pickup apparatus, the first light emitting source is disposed at one side of the third light emitting source, and the second light emitting source is disposed at the other side of the third light emitting source;
    a first light receiver configured to receive the first laser beam reflected by one of the optical recording media; and
    a second light receiver configured to receive the second laser beam and the third laser beam each reflected by one of the optical recording media,
    wherein the objective lens is compatible with all the wavelengths of the first to third laser beams and having such a characteristic that a phase direction of coma aberration generated in the second laser beam and a phase direction of coma aberration generated in the third laser beam are opposite to each other.

2. The optical pickup apparatus of claim 1, wherein the light emitting device further comprises a covering part covering the first, second and third light emitting sources so that the first, second and third laser beams are emitted through the same hole of the covering part.

3. The optical pickup apparatus of claim 1, wherein
    the first light emitting source is included in a first light emitting chip,
    the second and third light emitting sources are included in a second light emitting chip different from the first light emitting chip, and
    the first and second light emitting chips are mounted on the same mounting plane so that the first light emitting chip is adjacent to the third light emitting source in the second light emitting chip.

4. The optical pickup apparatus of claim 3, wherein the first light emitting source and the second light emitting source are arranged symmetrically about the third light emitting source.

5. The optical pickup apparatus of claim 1, wherein
    the first laser beam is in a blue-violet wavelength range of 400 to 420 nm,
    the second laser beam is in a red wavelength range of 645 to 675 nm, and
    the third laser beam is in an infrared wavelength range of 765 to 805 nm.

* * * * *